US009318088B1

(12) United States Patent
Huang

(10) Patent No.: US 9,318,088 B1
(45) Date of Patent: Apr. 19, 2016

(54) BUZZER CIRCUIT

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventor: Yong-Zhao Huang, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/590,368

(22) Filed: Jan. 6, 2015

(30) Foreign Application Priority Data

Nov. 18, 2014 (CN) .......................... 2014 1 0656331

(51) Int. Cl.
*H03K 3/00* (2006.01)
*G10K 9/12* (2006.01)

(52) U.S. Cl.
CPC ........................................ *G10K 9/12* (2013.01)

(58) Field of Classification Search
None
See application file for complete search history.

(56) References Cited

U.S. PATENT DOCUMENTS

2002/0180593 A1* 12/2002 Uemura ................ B06B 1/0238 340/388.1
2010/0188123 A1* 7/2010 Fox ........................ H03K 17/22 327/143
2015/0317969 A1* 11/2015 Huang ..................... G10K 9/12 340/388.1
2015/0317970 A1* 11/2015 Huang ..................... G10K 9/12 340/388.1

* cited by examiner

*Primary Examiner* — Long Nguyen
(74) *Attorney, Agent, or Firm* — Novak Druce Connolly Bove + Quigg LLP

(57) ABSTRACT

A buzzer circuit is connected to a drive circuit. The buzzer circuit includes a buzzer and a control unit. The control unit includes an electronic switch, a first resistor, a second resistor, and a constant voltage component. A control end of the electronic switch is connected to a power pin of the buzzer through the first resistor, and is grounded through the constant voltage component. A first end of the electronic switch is connected to a grounded pin of the buzzer. A second end of the electronic switch is grounded through the second resistor. When the buzzer receives a high level drive signal, the electronic switch is turned on. A voltage between the control end and the second end of the electronic switch is constant, the constant voltage component provides a constant voltage to the second resistor, and a current of the second resistor is constant.

2 Claims, 2 Drawing Sheets

BUZZER CIRCUIT

FIELD

The subject matter herein generally relates to a buzzer circuit.

BACKGROUND

A current of a traditional buzzer changes over time, which may result in an unsteady sound from the traditional buzzer.

BRIEF DESCRIPTION OF THE DRAWINGS

Implementations of the present technology will now be described, by way of example only, with reference to the attached figures.

DETAILED DESCRIPTION

Figure 1:
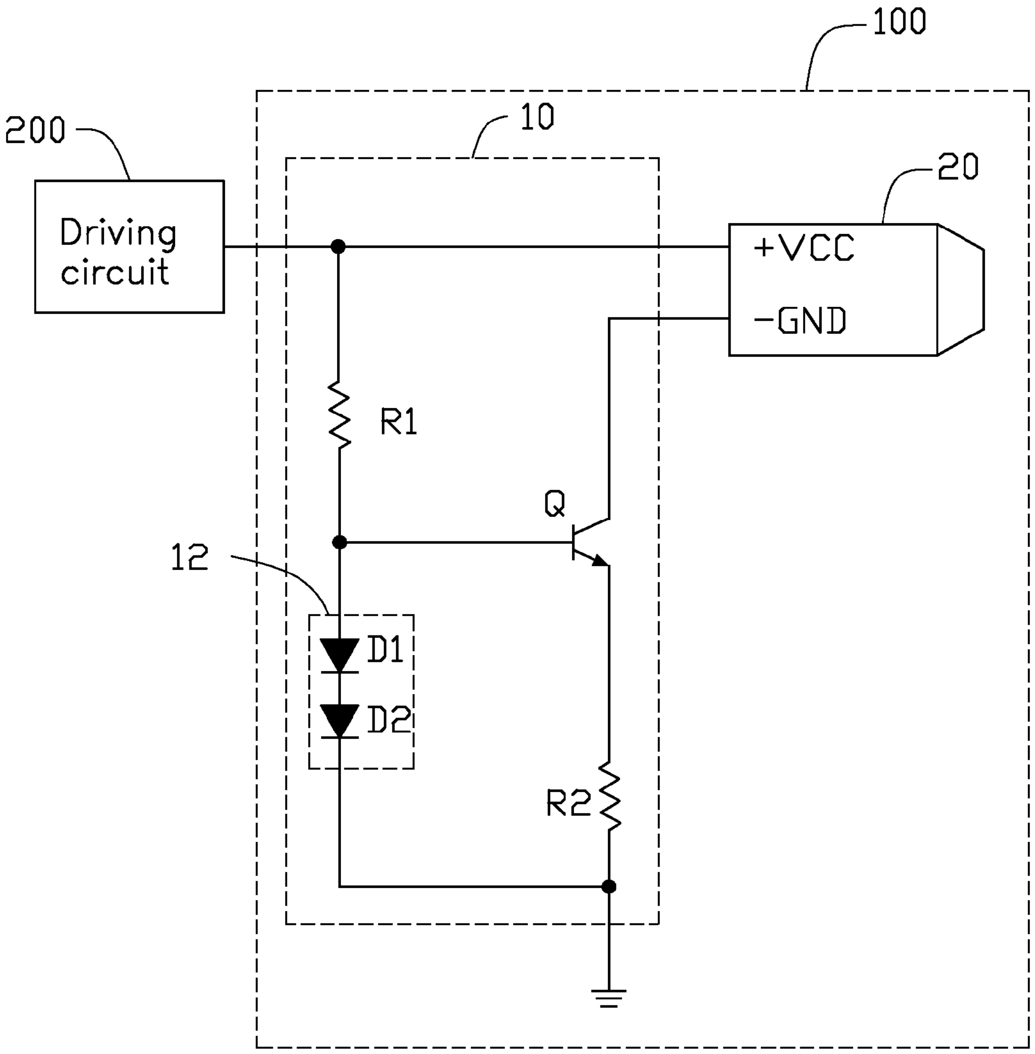
FIG. 1 is a circuit diagram of a first embodiment of a buzzer circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series and the like.

The present disclosure is described in relation to a buzzer circuit.

FIG. 1 illustrates a first embodiment of the buzzer circuit 100. A drive circuit 200 is coupled to the buzzer circuit 100 for energizing the buzzer circuit 100. The buzzer circuit 100 can comprise a control unit 10 and a buzzer 20.

The buzzer 20 can comprise a power pin VCC and a ground pin GND. The power pin VCC is coupled to the drive circuit 200.

The control unit 10 can comprise a first resistor R1, a second resistor R2, a bipolar junction transistor Q, and a constant voltage component 12. The constant voltage component 12 can comprise two tandem diodes D1 and D2. A base of the bipolar junction transistor Q is coupled to the power pin VCC of the buzzer 20 through the first resistor R1. A collector of the bipolar junction transistor Q is coupled to the ground pin GND of the buzzer 30. An emitter of the bipolar junction transistor Q is grounded through the second resistor R2. An anode of the diode D1 is coupled to the base of the bipolar junction transistor Q. A cathode of the diode D1 is coupled to an anode of the diode D2. A cathode of the diode D2 is grounded.

The power pin VCC of the buzzer 20 receives a high level drive signal when the drive circuit 200 outputs a high level signal. At the same time, the bipolar junction transistor Q, the diode D1, and diode D2 is turned on. The ground pin GND of the buzzer 20 is grounded through the collector and the emitter of the bipolar junction transistor Q and the resistor R2 in that order. A voltage of the diode D1 plus a voltage of the diode D2 are equal to a voltage between the base and the emitter of the bipolar junction transistor Q plus a voltage of the second resistor R2. Wherein, Vbe stands for the voltage between the base and the emitter of the bipolar junction transistor Q, VD stands for a forward voltage of the diode D1 and diode D2, r stands for a resistance of the resistor R2, I stands for an operating current of the buzzer 20 and for a current flowing through the resistor R2, and I is defined by the equation $I=(2VD-Vbe)/r$. Voltage Vbe is a constant value when the bipolar junction transistor Q is turned on, and the operating current I is constant. The buzzer 20 buzzes steadily.

Figure 2:
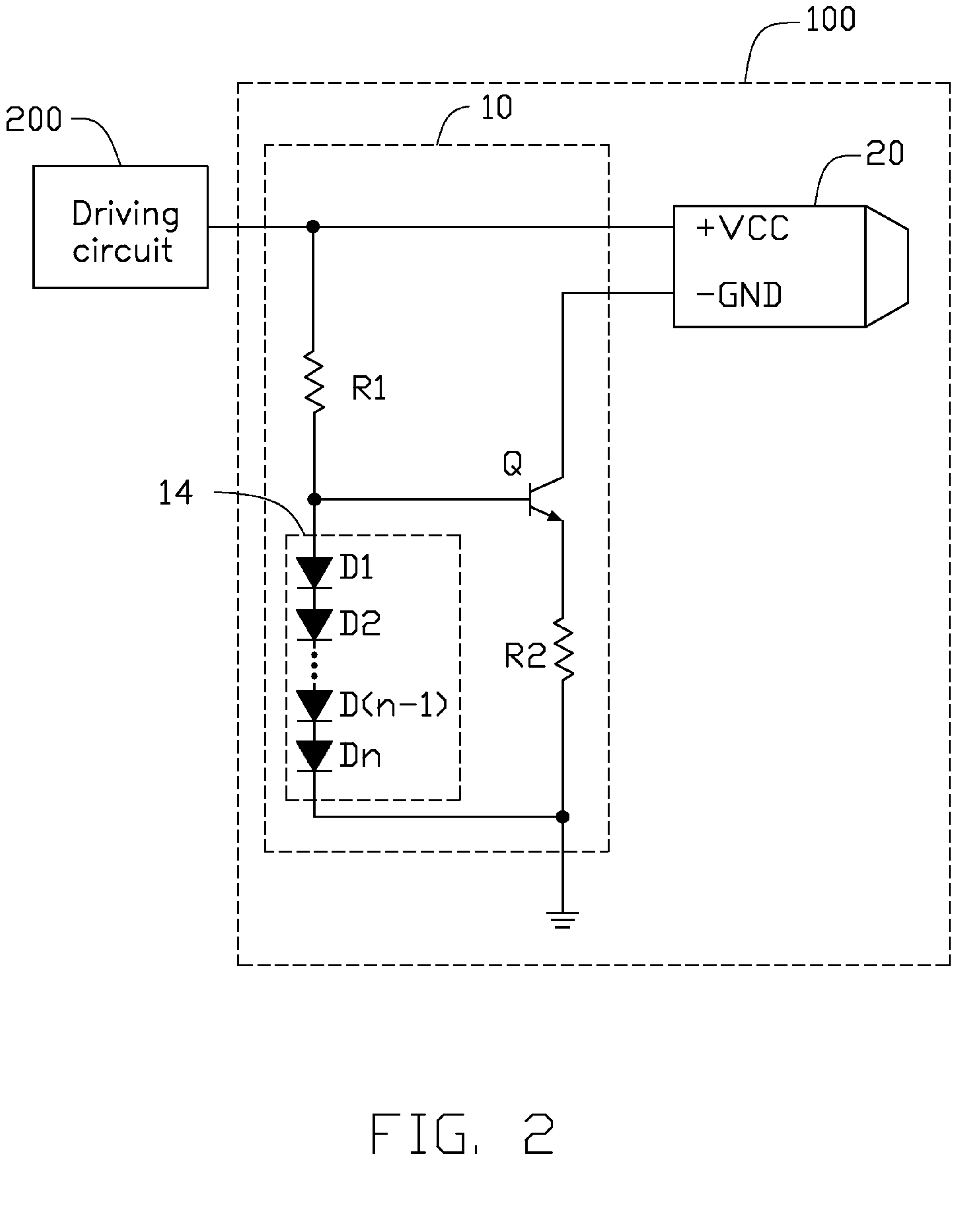
FIG. 2 is a circuit diagram of a second embodiment of the buzzer circuit.

FIG. 2 illustrates a second embodiment of the buzzer circuit 100. The constant voltage component 14 can comprise a plurality of diodes D1, D2, . . . D(n−1), and Dn, wherein n can be a integer and $n \geq 3$. An anode of the diode D1 is coupled to the base of the bipolar junction transistor Q. A cathode of the diode D1 is coupled to an anode of the diode D2. The rest can be done in the same manner. A cathode of the diode D(n−1) is coupled to an anode of the diode Dn. A cathode of the diode Dn is grounded. Wherein VD stands for a forward voltage of the diode D1, diode D2, . . . diode D(n−1), and diode Dn, then the operating current I of the buzzer 20 is defined by the equation $I=(n*VD-Vbe)/r$.

In other embodiments, the operating current I of the buzzer 20 can also be changed through changing the resistance of the resistor R2.

In at least one embodiment, the bipolar junction transistors Q can be an npn bipolar junction transistor.

The embodiments shown and described above are only examples. Many details are well known by those in the art therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A buzzer circuit coupled to a drive circuit, the buzzer circuit comprising:

a buzzer comprising a power pin and a ground pin, wherein the power pin is coupled to the drive circuit for receiving a drive signal from the drive circuit; and a control unit comprising an NPN bipolar junction transistor, a first resistor, a second resistor, and a constant voltage component;

wherein a base of the bipolar junction transistor is coupled to the power pin of the buzzer through the first resistor, the base of the bipolar junction transistor is grounded through the constant voltage component, a collector of the bipolar junction transistor is coupled to the ground pin of the buzzer, an emitter of the bipolar junction transistor is grounded through the second resistor, the bipolar junction transistor is turned on when the power pin of the buzzer receives a high level drive signal, a voltage between the base and the emitter of the bipolar junction transistor is constant, the constant voltage component provides a constant voltage to the second resistor, and a current of the second resistor is constant.

2. The buzzer circuit of claim 1, wherein the constant voltage component can comprise at least two tandem diodes coupled in series, and the base of the bipolar junction transistor is grounded through the at least two tandem diodes.

* * * * *